United States Patent [19]

Takeuchi et al.

[11] Patent Number: 4,994,889
[45] Date of Patent: Feb. 19, 1991

[54] SEMICONDUCTOR MEMORY DEVICE

[75] Inventors: Yukio Takeuchi, Kawasaki; Satoshi Shinozaki, Yokohama, both of Japan

[73] Assignee: Kabushiki Kaisha Toshiba, Kawasaki, Japan

[21] Appl. No.: 335,721

[22] Filed: Dec. 2, 1987

Related U.S. Application Data

[63] Continuation of Ser. No. 811,714, Dec. 20, 1985, abandoned.

[30] Foreign Application Priority Data

Dec. 28, 1984 [JP] Japan ................ 59-276181

[51] Int. Cl.$^5$ .................................. H01L 27/10
[52] U.S. Cl. ........................ 357/45; 357/23.5; 357/23.6; 357/41; 357/55; 357/90
[58] Field of Search .............. 357/23.5, 23.6, 41, 357/45, 55, 90

[56] References Cited

U.S. PATENT DOCUMENTS 4,364,075 12/1982 Bohr .......................... 357/23
4,413,401 11/1983 Klein et al. ................. 357/23.6
4,536,944 8/1985 Bracco et al. .............. 357/23.6

OTHER PUBLICATIONS

Fujitsu-Patent Abstracts of Japan, vol. 6, No. 52 (E-100) [930] 4/7/82; JP-A-56 164570 17-12-1981.
Pp. 463 and 467 from the IEEE Journal of Solid-State Circuits, vol. SC-18, No. 5, Oct. 1983.
Taniguchi et al., "Fully Boosted 64K Dynamic RAM With Automatic and Self-Refresh," IEEE Journal of Solid-States Circuit, vol. SC-16, No. 5, pp. 492-498, Oct. 1981.
Smayling et al., "256-K Dynamic RAM is More Than Just an Upgrade," Electronics, vol. 56, No. 17, pp. 135-137, Aug. 25, 1983.

Primary Examiner—Edward J. Wojciechowicz
Attorney, Agent, or Firm—Finnegan, Henderson, Farabow, Garrett and Dunner

[57] ABSTRACT

A semiconductor memory device includes a memory cell array comprised of a plurality of memory cells each having a single transfer transistor and a single capacitor and a peripheral circuit including a plurality of drive transistors and adapted to drive the memory cell. The source and drain regions of the transfer transistor have an impurity concentration lower in level than that of the source and drain regions of the drive transistor.

10 Claims, 3 Drawing Sheets

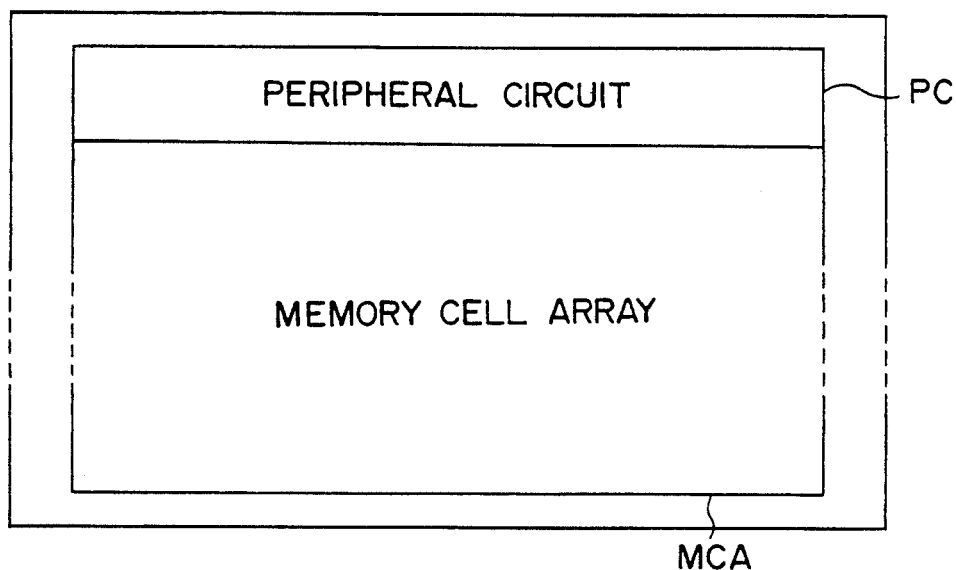
F I G. 3

SEMICONDUCTOR MEMORY DEVICE

This application is a continuation of application Ser. No. 06/811,714, filed Dec. 20, 1985, now abandoned.

BACKGROUND OF THE INVENTION

This invention relates to a semiconductor memory device including memory cells each comprised of one transistor and one capacitor and a peripheral circuit comprised of transistors and adapted to drive the memory cell.

In a conventional one-transistor/one-capacitor type dynamic memory cell, for example, it is known that a polysilicon or metal silicide is used as a material for a bit line which is connected through a contact hole to a source or drain region of a MOS transistor in the respective cell. The arrangement and manufacture of this type of memory cells will now be explained below with reference to FIG. 1.

Field oxide film 1 is formed on the surface of p type silicon substrate 2 and then selectively removed to expose part of the surface of substrate 2. Capacitor oxide films 3A, 3B and capacitor electrodes 4A, 4B are sequentially formed in that order on predetermined areas of the exposed surface of the substrate. In this way capacitor sections are formed which comprise capacitor electrodes 4A, 4B, capacitor oxide films 3A, 3B and substrate 2.

Then, interlayer insulating film 5 is formed on capacitor electrodes 4A, 4B; and gate oxide films 6A, 6B and transfer gate electrodes 7A, 7B are sequentially formed on those areas of the surface of substrate 2 where no capacitor section is formed. With capacitor electrodes 4A, 4B and transfer gate electrodes 7A, 7B as masks, an n type impurity is doped by an ion implantation method into substrate 2 to form $n^+$ type impurity regions 8A, 8B, 8C for a source and drain. Insulating layer 9 is formed on the whole surface of the resultant structure, and contact hole 10 is formed in insulating layer 9 to partially expose $n^+$ type impurity region 8C. Then, a polysilicon layer or metal silicide layer is formed on insulating film 9 and on the exposed surface of impurity region 8C. An n type impurity is doped into the polysilicon layer or metal silicide layer, followed by performing a heat treatment step to form high impurity concentration $n^{++}$ type contact region 11. The resultant polysilicon layer or metal silicide layer is patterned to provide bit line 12. A semiconductor memory device is obtained in this way.

With an increase in dynamic memory capacity there is a tendency toward reducing an occupation area of a cell capacitor and, at the same time, thinning a capacitor oxide film to obtain a large cell capacitance.

FIG. 2 shows a memory device which is formed, taking into consideration a problem arising from the formation of a large-capacity dynamic memory. In this memory cell, n type regions 13A and 13B are formed in contact with $n^+$ type regions 8A and 8B and beneath oxide films 3A and 3B, respectively. Furthermore, $p^+$ type regions 14A and 14B are formed in contact with the undersurfaces of n type regions 13A and 13B. The formation of n type regions 13A, 13B causes an increase in impurity concentration level at those surface portions of substrate 2 situated beneath oxide films 3A, 3B. It is, therefore, possible to prevent a p type inversion layer or depletion layer from being formed beneath capacitor oxide films 3A, 3B when capacitor electrodes 4A, 4B are set at a certain potential level. This prevents a decrease in capacitance of the capacitor section including capacitor oxide films 3A, 3B.

In order to obtain the afore-mentioned effect the impurity concentration at the surface portions of n type regions 13A, 13B should be set at a high level of about $1 \times 10^{18}$ to $1 \times 10^{19}$ cm$^{-3}$, though differing dependent upon the thickness of capacitor oxide films 3A, 3B as well as the potential at which capacitor electrodes 4A, 4B are set. $p^+$ type regions 14A, 14B are formed to prevent an operation error resulting from a soft error which is a serious problem involved in a dynamic memory. $p^+$ type regions 14A, 14B are formed such that they have an impurity concentration of approximately above $1 \times 10^{17}$ cm$^{-3}$ to permit a recombination, with holes, of electrons liberated from electron-hole pairs occurring in the substrate by an α ray.

In a memory device having the conventional dynamic memory cells as shown in FIGS. 1 and 2, an $n^+$ type impurity is doped simultaneously into the source and circuit, not shown, for driving the memory cell array and into the source and drain regions of a transistor of each memory cell. Where contact is made between $n^+$ type region 8C and the polysilicon layer or metal silicide layer for forming bit line 12, a natural oxide film is formed on the surface of $n^+$ type region 8C at the contact section and acts as a barrier, failing to obtain better ohmic contact between bit line 12 and $n^+$ type region 8C.

One solution to this problem is to perform a heat treatment step at above 1000° C. for barrier breakage. With the recent trend toward the high integration density of elements and the consequent microminiaturization of gate electrodes and source and drain regions, if a high temperature heat treatment is conducted, the diffusion length of the source and drain regions becomes greater, causing a short channel effect and the resultant degradation in characteristics of transistors.

In the dynamic memory device as shown in FIG. 2, $n^+$ type regions 8A and 8B contact $p^+$ type regions 14A and 14B, respectively, for soft error prevention, thereby increasing a memory cell capacitance due to an increase in junction capacitance. However, the presence of the junction capacitance increases the number of generation/recombination centers and thus the leakage current, prominently reducing a pause time on which emphasis is placed in the dynamic memory.

SUMMARY OF THE INVENTION

This invention provides a semiconductor memory device for permitting better direct contact to readily be obtained with respect to a source or drain of a transistor in a memory cell.

This object can be achieved by providing a semiconductor device comprising a plurality of one-transistor/one-capacitor memory cells and a peripheral circuit for driving the memory cells, in which the source and drain regions of the transistor in the memory cell have an impurity concentration lower than that of the source and drain regions of the transistor in the peripheral circuit.

According to this invention, even if the source and drain regions in the respective memory cell are exposed, no natural oxide film is formed, owing to the lower impurity concentration of the source and drain regions, to an extent to which a barrier is formed. Furthermore, that portion of the source or drain region, which is in contact with the bit line, becomes higher in impurity concentration owing to the impurity diffused from the bit line, thus obtaining good ohmic contact between the source or drain region and the bit line.

BRIEF DESCRIPTION OF THE DRAWINGS

FIG. 3 is a plan view schematically showing a semiconductor memory device according to one embodiment of this invention.

DETAILED DESCRIPTION OF THE PREFERRED EMBODIMENT

FIG. 3 is a plan view schematically showing a semiconductor memory device according to one embodiment of this invention. The semiconductor memory device comprises a memory cell array MCA having a plurality of memory cells each including a single capacitor and a single transfer transistor and a peripheral circuit PC comprised of a plurality of peripheral transistors.

A method for manufacturing a semiconductor memory device of FIG. 3 will be explained below with reference to FIGS. 4A to 4F. FIGS. 4A to 4F show a boundary portion of the memory device which is defined between a memory cell array MCA and a peripheral circuit PC. In the semiconductor structure shown in FIGS. 4A to 4F, one of memory cells is indicated on the left side and one of transistors in the peripheral circuit for driving the memory cells is indicated on the right side.

Figure 1:
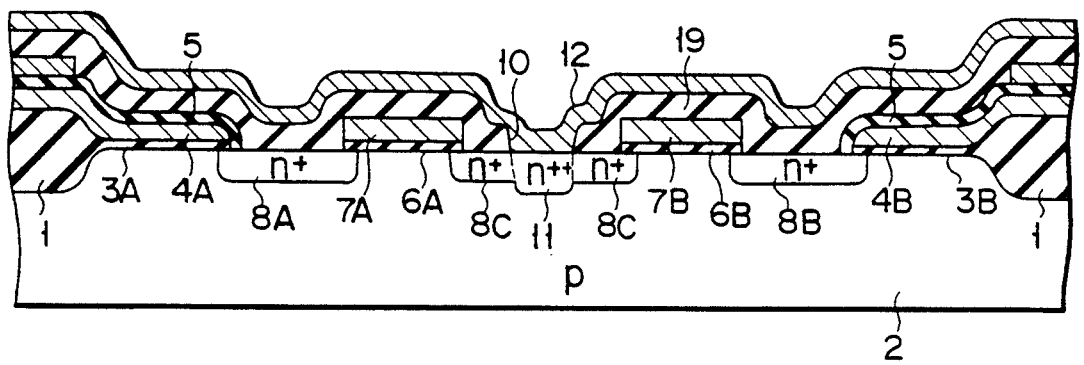
FIGS. 1 and 2 are cross-sectional views showing a conventional semiconductor memory cell.
Figure 2:
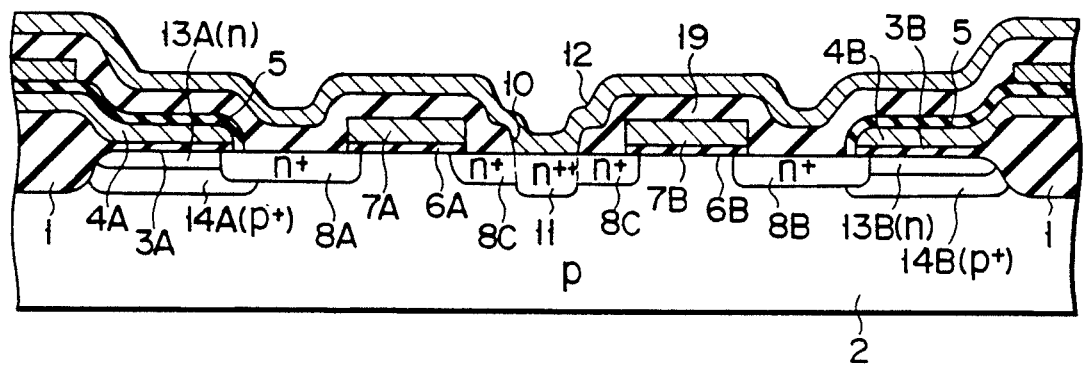
Figure 4A:
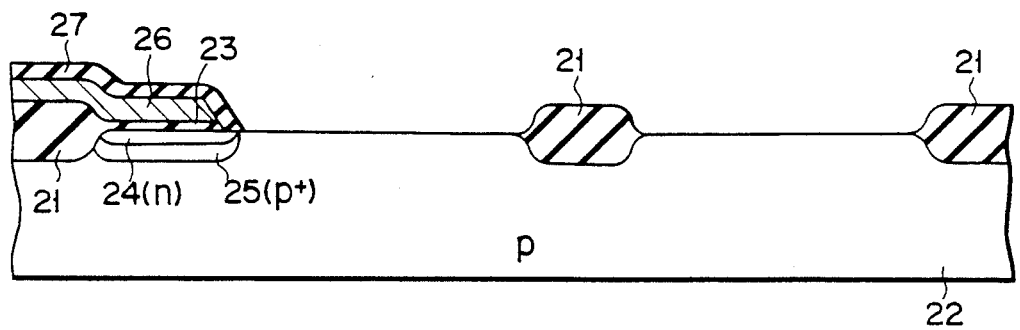
FIGS. 4A to 4F are explanatory views showing the steps of manufacturing a semiconductor memory device shown in FIG. 3.

As shown in FIG. 4A, a field insulating film is selectively formed on p type silicon substrate 22 and capacitor oxide film 23 of, for example, 25 nm in thickness is formed by a thermal oxidation method on the predetermined area of the resultant structure. Arsenic is ion implanted into the surface region of substrate 22 at a capacitor section to form n type region 24 and boron is deeply ion implanted into the same surface region to form p+ type region 25 for soft error prevention. Then, a polysilicon film of, for example, 400 nm in thickness is formed on the surface of the resultant semiconductor structure and, for example, phosphorus is doped into the polysilicon film to form an n type silicon film of low resistance. The low resistance polysilicon film is patterned to provide capacitor electrode 26. The surface of capacitor electrode 26 is oxidized to provide a 200 nm-thick interlayer insulating film 27. Thus a semiconductor structure as shown in FIG. 4A is obtained.

The surface of the resultant structure as shown in FIG. 4A is thermally oxidized to provide an oxide film of 35 nm in thickness for the formation of gate oxide films 28A and 28B for the transfer transistor and peripheral circuit transistor, respectively. A 400 nm-thick polysilicon film is formed on the surface of the resultant semiconductor structure and phosphorus, for example, is doped to provide a low resistance polysilicon film. The low resistance polysilicon film is patterned to form gate electrodes 29A, 29B for the transfer transistor and peripheral circuit transistor. With gate electrodes 29A and 29B as a mask the exposed oxide film is etched in a self-aligned fashion to provide gate oxide films 28A and 28B. Then, with gate electrodes 29A, 29B, capacitor electrode 26 and field oxide film as a mask, for example, phosphorus is ion implanted into the substrate 22 at an acceleration energy of 25 keV and a dosage of $2 \times 10^{13}$ cm$^{-2}$. The resultant structure is annealed to form n$^-$ type regions 30A and 30B in the source and drain regions of the transfer transistor and peripheral circuit transistor and thus to obtain a semiconductor structure.

Figure 4B:
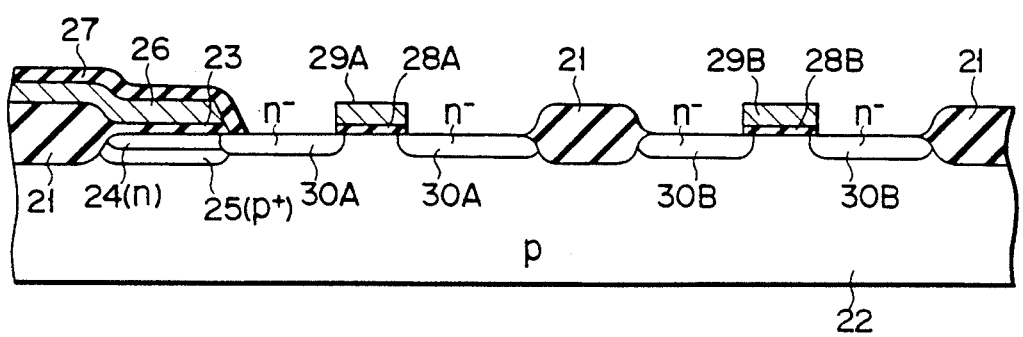

A CVD oxide film of, for example, 300 nm in thickness is formed on the surface of the resultant structure as shown in FIG. 4B and the CVD oxide film is etched, by a reactive ion etching method such as an anisotropic etching method, to leave CVD oxide film portions on the side walls of gate electrodes 29A, 29B. In this way it is possible to obtain a semiconductor structure as shown in FIG. 4C.

Figure 4C:
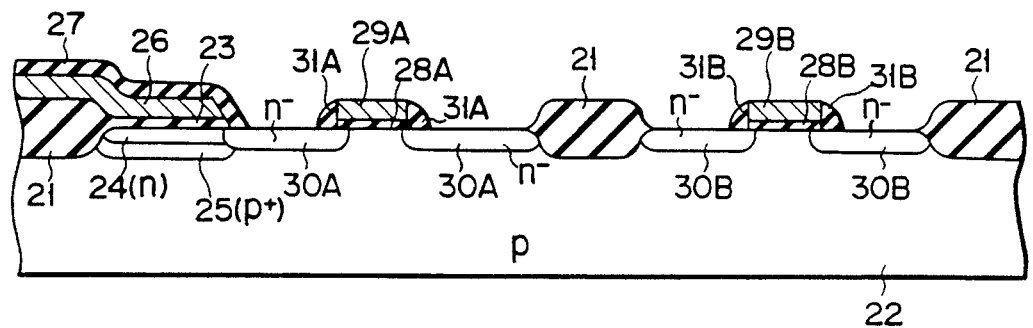

Photoresist pattern 32 is formed on other than the peripheral circuit area of the semiconductor structure shown in FIG. 4C. With photoresist pattern 32 and gate electrode 29B and field oxide film 21 in the peripheral circuit area as a mask, for example, arsenic is ion implanted at an acceleration energy of 40 keV and dosage of $3 \times 10^{15}$ cm$^{-2}$ only in the source and drain regions in the transistor of the peripheral circuit area, followed by performing an annealing step to form n$^+$ type region 33. In this way, it is possible to obtain a semiconductor device as shown in FIG. 4D.

Figure 4D:
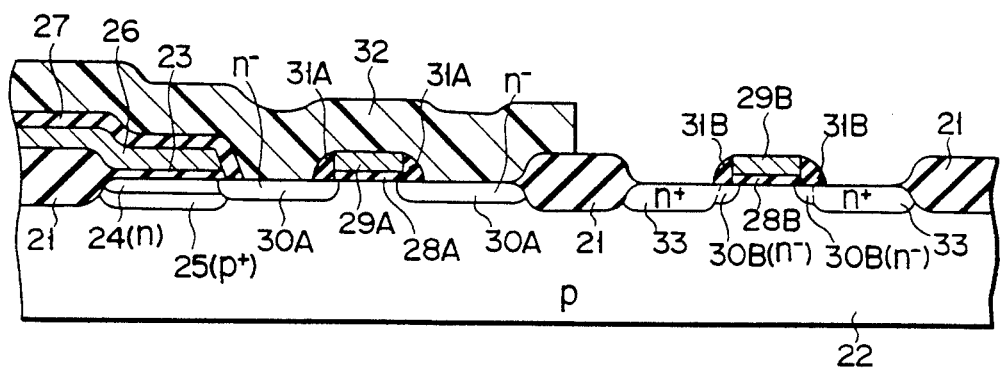
Figure 4E:
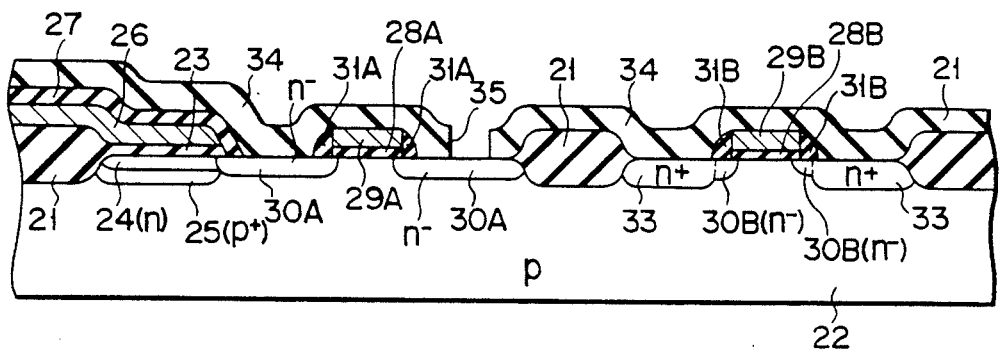

Photoresist pattern 32 is removed from the upper surface of the semiconductor structure shown in FIG. 4D and 300 nm-thick CVD oxide film 34 is formed on the surface of the resultant structure. As shown in FIG. 4E, the portion of CVD oxide film 34 corresponding to drain 30A in the transfer transistor is selectively etched away to provide contact hole 35.

A polysilicon layer of, for example, 400 nm is formed on the surface of the resultant semiconductor structure as shown in FIG. 4E. Phosphorus is doped into the polysilicon layer by heat treating the resultant structure in a POCl$_3$ atmosphere for 30 minutes at 900° C.

Figure 4F:
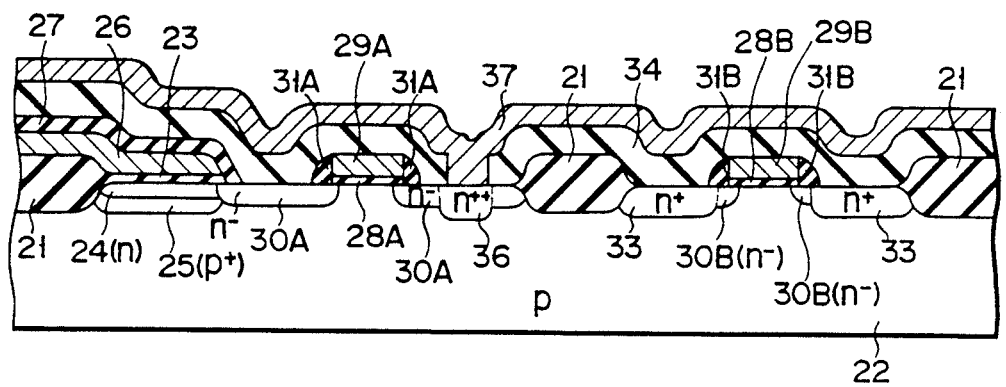

At this time, phosphorus is also diffused into n$^-$ type drain region 30A of the transfer transistor through the polysilicon layer in contact hole 35 to form high impurity concentration n$^{++}$ type region 36. Direct contact of ohmic contact property is obtained between n$^{++}$ type region 36 and the polysilicon layer. The polysilicon layer is patterned to form bit line 37 as shown in FIG. 4F. The CVD oxide film or PSG film is formed on the surface of the semiconductor structure as shown in FIG. 4F and a contact hole for aluminum interconnection is formed on the CVD oxide film or PSG film to provide an aluminum interconnection layer. In this way a dynamic memory device is formed.

Even if drain region 30A in the transfer transistor is partially exposed in the dynamic memory device so obtained, since drain region 30A is so formed as to have a low impurity concentration level of about $1 \times 10^{18}$ cm$^{-3}$, it is possible to prevent occurrence of an interface barrier due to the formation of the natural oxide film on the exposed portion of drain region 30. Therefore, this invention obviates the necessity of using a phosphorus diffusion step at high temperatures as well as ion implantation step under a high acceleration rate and high dosage for barrier destruction through ion mixing. It is, therefore, possible to obtain an adequate ohmic contact.

As p type region 25 for soft error prevention is formed in contact with n$^-$ type region 30A, the formation of generation/recombination centers in the p$^+$–n$^-$ junction area can be suppressed to a smaller extent and there is no possibility of reducing the pause time in the array.

In the formation of the transistor in the peripheral circuit PC two mask-aligning steps are necessary so as to dope an impurity into source and drain regions in the transistor. Where, for example, the peripheral circuit PC is comprised of CMOS devices, the p-channel MOS transistor region and memory cell array MCA are simultaneously blocked with the resist, thus requiring no additional mask-aligning step in practice.

Although this invention has been explained in connection with one embodiment, it is not restricted thereto. In the above-mentioned embodiment, for example, bit line 37 is formed of the polysilicon. However, use is made, as such, of a high melting point metal silicide or a polycide i.e. a composite material of a polysilicon and high melting point metal silicide. Although an impurity has been doped in a $POCl_3$ atmosphere into the polysilicon layer so as to form bit line 37, it may be doped into the polysilicon layer instead by virtue of the ion implantation method.

It is possible to omit n type region 24 and $p^+$ type region 25.

What is claimed is:

1. A semiconductor memory device comprising:
   a semiconductor substrate on which a memory cell array and a peripheral circuit area for driving the memory cell array are provided;
   said memory cell array including a plurality of memory cells each comprised of a single transfer transistor, comprised of source and drain regions and a gate, and a single capacitor;
   said peripheral circuit area including a peripheral circuit including at least one driver transistor comprised of source and drain regions and a gate, said peripheral circuit being operatively coupled to said plurality of memory cells to drive said plurality of memory cells;
   a bit line formed of a polysilicon film or metal silicide, said bit line being formed in contact with one of said source and drain regions of the transfer transistor of at least one of said memory cells;
   wherein said source and drain regions of the transfer transistor in said memory cell have a low impurity concentration that precludes formation of a natural oxide film on a surface of the one of said source and drain regions in contact with said bit line; and
   wherein the source and drain regions of the transfer transistor in the memory cell have an impurity concentration lower than that of the source and drain regions of the driver transistor of said peripheral circuit.

2. A semiconductor memory device according to claim 1, further comprising:
   a contact region formed by an impurity diffusion from said polysilicon film or metal silicide and permitting ohmic contact to be made between the bit line and the one of said source and drain regions of the transfer transistor in contact with said bit line.

3. A semiconductor memory device according to claim 2, in which each of the source and drain regions of the drive transistor of said peripheral circuit has a high impurity region and a low impurity region formed in contact with said high impurity region and said source and drain regions of the transfer transistor in said memory cell are formed to have the same impurity concentration as that of the low impurity regions of said source and drain regions of said driver transistor in said peripheral circuit.

4. A semiconductor memory device according to claim 3, in which a capacitor in said memory cell includes an insulating layer formed on a surface of said substrate such that it is situated adjacent one of source and drain regions of said transfer transistor in said memory cell and a conductive layer formed as one plate of the capacitor on the insulating layer to cover a part of said substrate which forms the other plate of said capacitor and which is in contact with said one of source and drain regions.

5. A semiconductor memory device according to claim 4, in which said memory cell includes a first region of the other conductivity type formed in the surface portion of the substrate in contact with said one of source and drain regions of the transfer transistor in said memory cell and in opposition to said conductive layer and a second region of one conductivity type formed in contact with an undersurface of said first region.

6. A semiconductor memory device according to claim 2 in which a capacitor in said memory cell includes an insulating layer formed on a surface of said substrate such that it is situated adjacent one of source and drain regions of said transfer transistor in said memory cell and a conductive layer formed as one plate of the capacitor on the insulating layer to cover a part of said substrate which forms the other plate of said capacitor and which is in contact with said one of source and drain regions.

7. A semiconductor memory device according to claim 6, in which said memory cell includes a first region of the other conductivity type formed in the surface portion of the substrate in contact with said one of source and drain regions of the transfer transistor in said memory cell and in opposition to said conductive layer and a second region of one conductivity type formed in contact with an undersurface of said first region.

8. A semiconductor memory device according to claim 1, in which the source and drain regions of said driver transistor of said peripheral circuit have a high impurity region and allow impurity region formed in contact with said high impurity region; and said source and drain regions of the transfer transistor in said memory cell are formed by impurity regions having the same impurity concentration as that of the low impurity region of said source and drain regions of said driver transistor of said peripheral circuit.

9. A semiconductor memory device according to claim 1, in which a capacitor in said memory cell includes an insulating layer formed on a surface of said substrate such that it is situated adjacent one of source and drain regions of said transfer transistor in said memory cell and a conductive layer formed as one plate of the capacitor on the insulating layer to cover a part of said substrate which forms the other plate of said capacitor and which is in contact with said one of source and drain regions.

10. A semiconductor memory device according to claim 9, in which said memory cell includes a first region of the other conductivity type formed in the surface portion of the substrate in contact with said one of source and drain regions of the transfer transistor in said memory cell and in opposition to said conductive layer and a second region of one conductivity type formed in contact with an undersurface of said first region.

* * * * *